US012787184B2

(12) United States Patent
Bae et al.

(10) Patent No.: US 12,787,184 B2
(45) Date of Patent: Nov. 3, 2026

(54) HOUSING HAVING VENTILATION MEMBER ARRANGED THEREIN, AND ELECTRONIC DEVICE COMPRISING SAME

(71) Applicant: Samsung Electronics Co., Ltd., Suwon-si (KR)

(72) Inventors: Wonjung Bae, Suwon-si (KR); Donghee Kim, Suwon-si (KR); Changok Lim, Suwon-si (KR); Jinyong Kim, Suwon-si (KR); Taehwa Jung, Suwon-si (KR); Youngkyu Kim, Suwon-si (KR); Jaeuk Ahn, Suwon-si (KR); Junhwan Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 474 days.

(21) Appl. No.: 18/468,250

(22) Filed: Sep. 15, 2023

(65) Prior Publication Data

US 2024/0008195 A1 Jan. 4, 2024

Related U.S. Application Data

(63) Continuation of application No. PCT/KR2022/003876, filed on Mar. 21, 2022.

(30) Foreign Application Priority Data

Mar. 24, 2021 (KR) ........................ 10-2021-0037931

(51) Int. Cl.
*H05K 5/02* (2006.01)
*G06F 1/16* (2006.01)
*H05K 5/00* (2006.01)

(52) U.S. Cl.
CPC ......... *H05K 5/0213* (2013.01); *G06F 1/1686* (2013.01); *H05K 5/0047* (2013.01)

(58) Field of Classification Search
CPC ... H05K 5/0213; H05K 5/0047; G06F 1/1686
(Continued)

(56) References Cited

U.S. PATENT DOCUMENTS 7,888,602 B2 2/2011 Park
8,194,055 B2 6/2012 Liu et al.
(Continued)

FOREIGN PATENT DOCUMENTS

CN 109995895 A 7/2019
KR 10-1997-0016382 A 5/1999
(Continued)

OTHER PUBLICATIONS

Extended European Search Report dated Jun. 28, 2024, issued in European Application No. 22776002.2-1218.
(Continued)

*Primary Examiner* — Avinash A Savani
*Assistant Examiner* — Dana K Tighe
(74) *Attorney, Agent, or Firm* — Jefferson IP Law, LLP

(57) ABSTRACT

An electronic device is provided. The electronic device includes a housing which forms the side surface and inner space of the electronic device, and a ventilation member, wherein an opening disposed at the side surface, an accommodation hole extending from the opening so as to allow an external device to be accommodated therein, and a through-hole through which the accommodation hole communicates with the inner space are formed in the housing, and the ventilation member is arranged in the housing to cover the through-hole.

20 Claims, 7 Drawing Sheets

201

(58) Field of Classification Search
USPC .......................................................... 454/184
See application file for complete search history.

(56) References Cited

U.S. PATENT DOCUMENTS

| | | | | |
|---|---|---|---|---|
| 9,577,697 | B2 | 2/2017 | Richmond et al. | |
| 9,621,219 | B1 | 4/2017 | Richmond et al. | |
| 9,843,863 | B2 | 12/2017 | Kim et al. | |
| 10,091,338 | B2 | 10/2018 | Amit et al. | |
| 10,250,729 | B1 | 4/2019 | Jeon et al. | |
| 10,310,557 | B1 | 6/2019 | Wu | |
| 10,389,007 | B1 | 8/2019 | Choi et al. | |
| 10,686,923 | B2 | 6/2020 | Jeon et al. | |
| 10,757,239 | B2 | 8/2020 | Seo et al. | |
| 2009/0237377 | A1* | 9/2009 | Lai | G06F 3/03545 361/679.46 |
| 2012/0018336 | A1 | 1/2012 | Liu et al. | |
| 2015/0114090 | A1 | 4/2015 | Fukuda | |
| 2015/0156290 | A1 | 6/2015 | Amit et al. | |
| 2016/0277835 | A1 | 9/2016 | Kim et al. | |
| 2016/0352383 | A1 | 12/2016 | Richmond et al. | |
| 2017/0117930 | A1 | 4/2017 | Richmond et al. | |
| 2019/0068770 | A1 | 2/2019 | Seo et al. | |
| 2022/0174827 | A1* | 6/2022 | Jung | H04N 23/00 |

FOREIGN PATENT DOCUMENTS

| | | | |
|---|---|---|---|
| KR | 10-2008-0105849 | A | 12/2008 |
| KR | 10-2015-0009022 | A | 1/2015 |
| KR | 10-2015-0049292 | A | 5/2015 |
| KR | 10-2015-0062691 | A | 6/2015 |
| KR | 10-1880465 | B1 | 7/2018 |
| KR | 10-2018-0092188 | A | 8/2018 |
| KR | 10-2019-0022094 | A | 3/2019 |
| KR | 10-2019-0140209 | A | 12/2019 |

OTHER PUBLICATIONS

Korean Office Action dated Jan. 8, 2025, issued in a Korean Patent Application No. 10-2021-0037931.

International Search Report dated Jul. 8, 2022, issued in International Patent Application No. PCT/KR2022/003876.

* cited by examiner

HOUSING HAVING VENTILATION MEMBER ARRANGED THEREIN, AND ELECTRONIC DEVICE COMPRISING SAME

CROSS-REFERENCE TO RELATED APPLICATION(S)

This application is a continuation application, claiming priority under § 365(c), of an International application No. PCT/KR2022/003876, filed on Mar. 21, 2022, which is based on and claims the benefit of a Korean patent application number 10-2021-0037931, filed on Mar. 24, 2021, in the Korean Intellectual Property Office, the disclosure of which is incorporated by reference herein in its entirety.

BACKGROUND

1. Field

The disclosure described relates to a housing having a ventilation member disposed therein and an electronic device including the same.

2. Description of Related Art

An electronic device may include a housing that forms an exterior. Various parts of the electronic device may be disposed in the housing. The inside of the housing may have an environment different from an external environment. For example, when the electronic device is exposed to a temperature change or an altitude change, the pressure in the housing and the pressure in the external environment may differ from each other. Due to the difference between the environments, the humidity in the housing may increase so that the housing may be covered with dew, or a sealing member, such as a gasket may be weakened so that foreign matter, such as dust or moisture may infiltrate into the housing. Therefore, the performance of the electronic device may be deteriorated.

To reduce the difference between the environment in the housing and the external environment, a method of maintaining an equilibrium state by forming a ventilation hole fluidically connected with the external environment in the housing has been used.

The above information is presented as background information only to assist with an understanding of the disclosure. No determination has been made, and no assertion is made, as to whether any of the above might be applicable as prior art with regard to the disclosure.

SUMMARY

For example, the ventilation hole fluidically connecting the inside and the outside of the electronic device may be formed in a housing of a camera module exposed outside the electronic device. However, since lenses, a flash, and microphone holes are densely arranged in the camera module, there may be a limitation in the design of the ventilation hole (e.g., a limitation in the area and the shape of the ventilation hole), and it may be difficult to secure ventilation performance required for the electronic device. In addition, the ventilation hole exposed to the outside may spoil the aesthetics of the electronic device.

Aspects of the disclosure are to address at least the above-mentioned problems and/or disadvantages and to provide at least the advantages described below. Accordingly, an aspect of the disclosure is to provide a housing having a ventilation member disposed therein and an electronic device including the same for securing required ventilation performance without spoiling the aesthetics of the electronic device.

Additional aspects will be set forth in part in the description which follows and, in part, will be apparent from the description, or may be learned by practice of the presented embodiments.

In accordance with an aspect of the disclosure, an electronic device is provided. The electronic device includes a housing that forms a side surface and an inner space of the electronic device and a ventilation member. The housing includes an opening located in the side surface, a receiving hole that extends from the opening such that an external device is accommodated in the receiving hole, and a through-hole that fluidically connects the receiving hole and the inner space. The ventilation member is disposed in the housing to cover the through-hole.

In accordance with an aspect of the disclosure, a housing of an electronic device is provided. The housing includes a support member, a cover disposed on the support member, and a ventilation member. The support member and the cover form an inner space of the housing together. The support member includes a receiving hole in which an electronic pen is accommodated and a through-hole that fluidically connects the receiving hole and the inner space. The ventilation member is disposed on the support member to cover the through-hole.

According to an embodiment of the disclosure, the degree of freedom in the design of the through-hole may be secured depending on required ventilation performance.

According to an embodiment of the disclosure, the ventilation hole may be formed in the receiving hole in which the external device (e.g., the electronic pen) is accommodated. Accordingly, ventilation performance may be secured without spoiling the design aesthetics of the electronic device.

According to an embodiment of the disclosure, since the ventilation hole is formed in the receiving hole in which the external device is accommodated, optimized design may be produced depending on required ventilation performance, and a reduction in manufacturing costs and an improvement in productivity may be achieved through simplification of a manufacturing process.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1A:
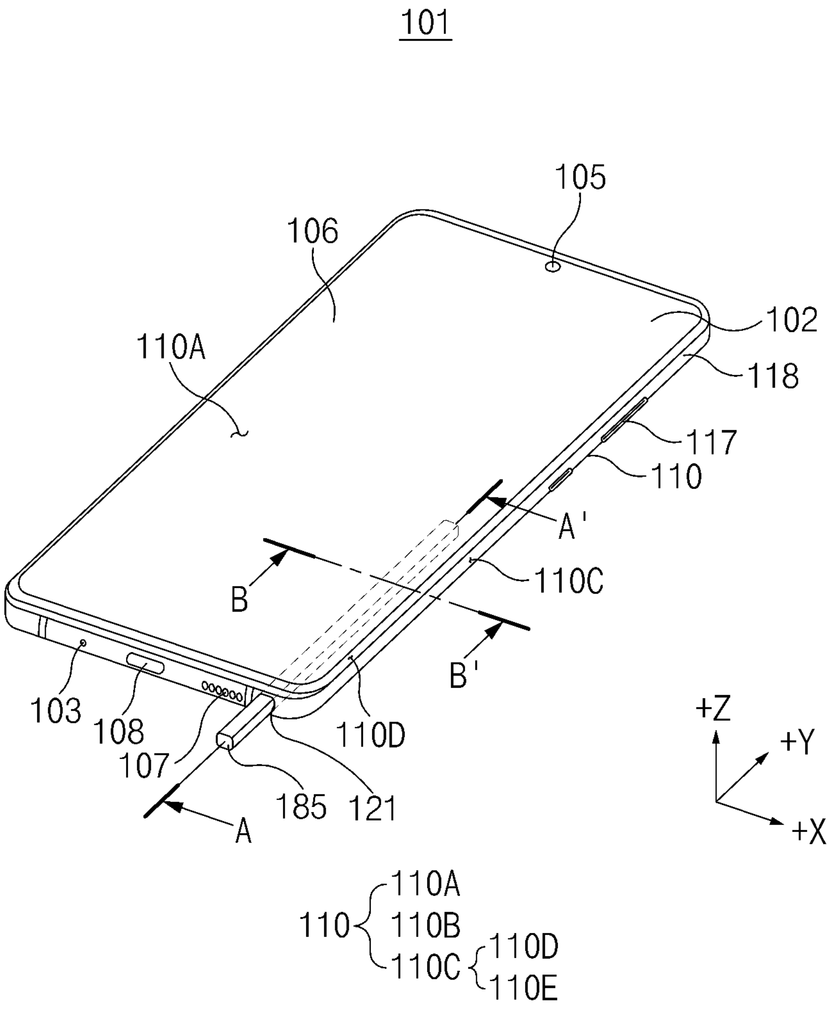
FIG. 1A is a front perspective view of an electronic device according to an embodiment of the disclosure.

FIG. 1A is a front perspective view of an electronic device according to an embodiment of the disclosure.

Figure 1B:
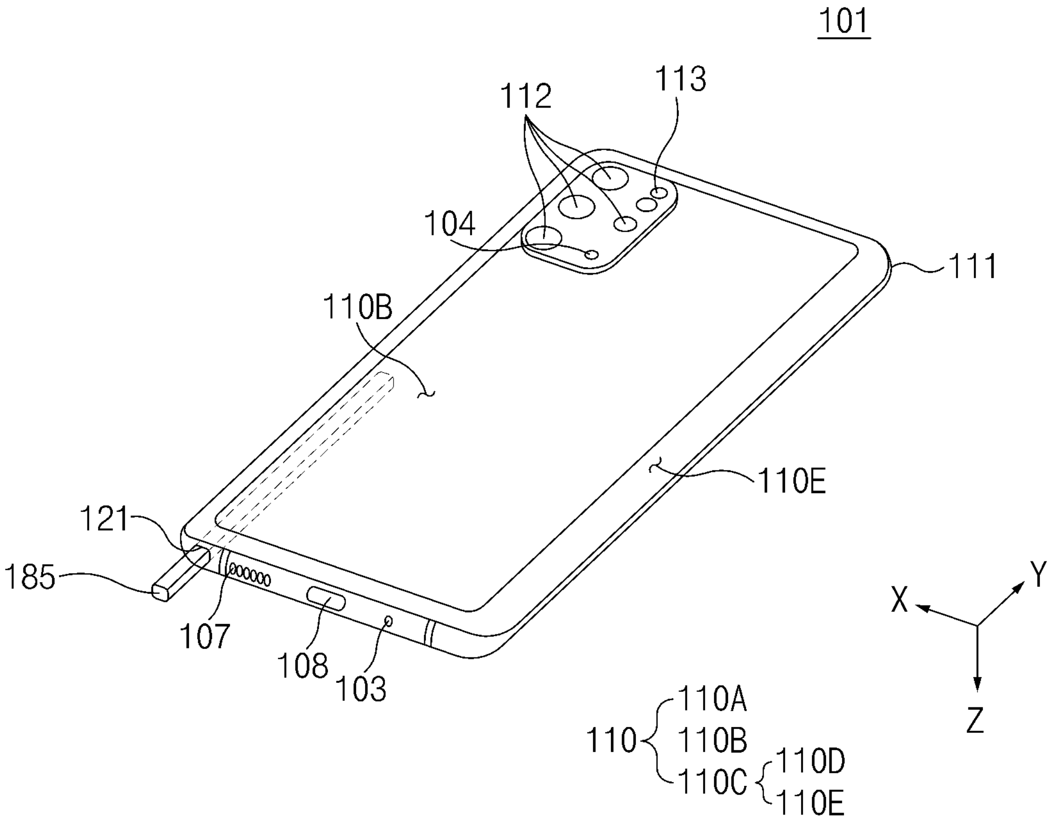
FIG. 1B is a rear perspective view of an electronic device according to an embodiment of the disclosure.

FIG. 1B is a rear perspective view of an electronic device according to an embodiment of the disclosure.

Referring to FIGS. 1A and 1B, the electronic device 101 (e.g., an electronic device 401 of FIG. 4) may include a housing 110 that includes a first surface (or, a front surface) 110A, a second surface (or, a rear surface) 110B, and a side surface 110C surrounding a space between the first surface 110A and the second surface 110B.

In another embodiment (not illustrated) of the disclosure, the housing 110 may refer to a structure that forms at least a part of the first surface 110A, the second surface 110B, and the side surface 110C.

In an embodiment of the disclosure, the first surface 110A may be formed by a front plate 102, at least a portion of which is substantially transparent (e.g., a glass plate including various coating layers, or a polymer plate). The second surface 110B may be formed by a back plate 111 that is substantially opaque. The back plate 111 may be formed of, for example, coated or colored glass, ceramic, a polymer, metal (e.g., aluminum, stainless steel (STS), or magnesium), or a combination of at least two of the aforementioned materials. The side surface 110C may be formed by a side bezel structure (or, a "frame structure") 118 that is coupled with the front plate 102 and the back plate 111 and that includes metal and/or a polymer.

In another embodiment of the disclosure, the back plate 111 and the side bezel structure 118 may be integrally formed with each other and may include the same material (e.g., a metallic material, such as aluminum).

In the illustrated embodiment of the disclosure, the front plate 102 may include two first regions 110D that curvedly and seamlessly extend from partial regions of the first surface 110A toward the back plate 111. The first regions 110D may be located at opposite long edges of the front plate 102.

In the illustrated embodiment of the disclosure, the back plate 111 may include two second regions 110E that curvedly and seamlessly extend from partial regions of the second surface 110B toward the front plate 102. The second regions 110E may be located at opposite long edges of the back plate 111.

In another embodiment of the disclosure, the front plate 102 (or, the back plate 111) may include only one of the first regions 110D (or, the second regions 110E). Furthermore, in another embodiment of the disclosure, the front plate 102 (or, the back plate 111) may not include a part of the first regions 110D (or, the second regions 110E).

In an embodiment of the disclosure, when viewed from a side of the electronic device 101, the side bezel structure 118 may have a first thickness (or, width) at sides (e.g., short sides) not including the first regions 110D or the second regions 110E and may have a second thickness at sides (e.g., long sides) including the first regions 110D or the second regions 110E, the second thickness being smaller than the first thickness.

Figure 4:
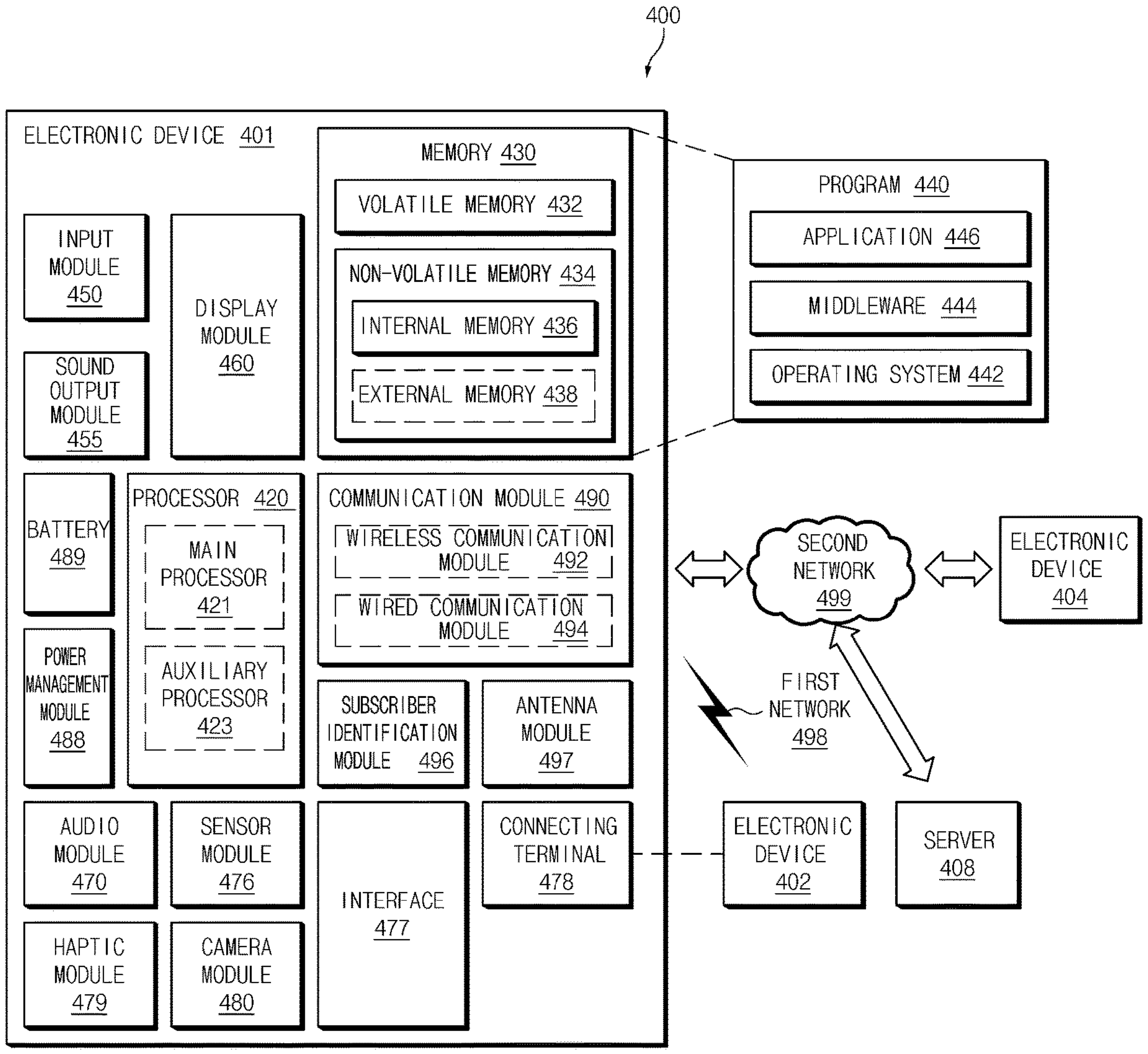
FIG. 4 is a block diagram of an electronic device in a network environment according to an embodiment of the disclosure.

In an embodiment of the disclosure, the electronic device 101 may include at least one of a display 106, audio modules 103, 104 and 107 (e.g., an audio module 470 of FIG. 4), a sensor module (not illustrated) (e.g., a sensor module 476 of FIG. 4), camera modules 105, 112, and 113 (e.g., a camera module 480 of FIG. 4), key input devices 117 (e.g., an input module 450 of FIG. 4), a light emitting element (not illustrated), or a connector hole 108 (e.g., a connecting terminal 478 of FIG. 4). In another embodiment of the disclosure, the electronic device 101 may not include at least one component (e.g., the key input devices 117 or the light emitting element (not illustrated)) among the aforementioned components, or may additionally include other component(s).

In an embodiment of the disclosure, the display 106 may be exposed through most of the front plate 102. For example, at least a portion of the display 106 may be exposed through the front plate 102 that includes the first surface 110A and the first regions 110D of the side surfaces 110C.

In an embodiment of the disclosure, the periphery of the display 106 may be formed to be substantially the same as the shape of the adjacent outside edge of the front plate 102. In another embodiment (not illustrated) of the disclosure, to expand the area by which the display 106 is exposed, the gap between the periphery of the display 106 and the periphery of the front plate 102 may be formed to be substantially constant.

In an embodiment of the disclosure, a surface of the housing 110 (or, the front plate 102) may include a screen display region that is formed as the display 106 is visually exposed. For example, the screen display region may include the first surface 110A and the first regions 110D of the side surface.

In another embodiment (not illustrated) of the disclosure, the screen display region 110A and 110D may include a sensing region (not illustrated) that is configured to obtain biometric information of a user. When the screen display region 110A and 110D includes the sensing region, this may mean that at least a portion of the sensing region overlaps the screen display region 110A and 110D. For example, the sensing region (not illustrated) may refer to a region capable of displaying visual information by the display 106 like other areas of the screen display region 110A and 110D and additionally obtaining biometric information (e.g., a fingerprint) of the user.

In an embodiment of the disclosure, the screen display region 110A and 110D of the display 106 may include a region through which the first camera module 105 (e.g., a punch hole camera) is visually exposed. For example, at least a portion of the periphery of the region through which the first camera module 105 is exposed may be surrounded by the screen display region 110A and 110D. In an embodiment of the disclosure, the first camera module 105 may include a plurality of camera modules (e.g., the camera module 480 of FIG. 4).

In another embodiment (not illustrated) of the disclosure, the display 106 may be coupled with, or disposed adjacent to, touch detection circuitry, a pressure sensor capable of measuring the intensity (pressure) of a touch, and/or a digitizer that detects a stylus pen of a magnetic field type.

In an embodiment of the disclosure, the audio modules 103, 104, and 107 may include the microphone holes 103 and 104 and the speaker hole 107.

In an embodiment of the disclosure, the microphone holes 103 and 104 may include the first microphone hole 103 formed in a partial region of the side surface 110C and the microphone hole 104 formed in a partial region of the second surface 110B. A microphone for obtaining external sound may be disposed in the microphone holes 103 and 104. The microphone may include a plurality of microphones to detect the direction of sound. In an embodiment of the disclosure, the second microphone hole 104 formed in the partial region of the second surface 110B may be disposed adjacent to the camera modules 105, 112, and 113. For example, the second microphone hole 104 may obtain sounds when the camera modules 105, 112, and 113 are executed, or may obtain sounds when other functions are executed.

In an embodiment of the disclosure, the speaker hole 107 may include an external speaker hole 107 and a receiver hole for telephone call (not illustrated). The external speaker hole 107 may be formed in a portion of the side surface 110C of the electronic device 101. In another embodiment of the disclosure, the external speaker hole 107, together with the microphone hole 103, may be implemented as a single hole. Although not illustrated, the receiver hole for telephone call (not illustrated) may be formed in another portion of the side surface 110C. For example, the receiver hole for telephone call (not illustrated) may be formed in another portion (e.g., a portion facing in the +Y-axis direction) of the side surface 110C that faces the portion (e.g., a portion facing in the −Y-axis direction) of the side surface 110C in which the external speaker hole 107 is formed.

In an embodiment of the disclosure, the electronic device 101 may include a speaker fluidically connected with the speaker hole 107. In another embodiment of the disclosure, the speaker may include a piezoelectric speaker that does not include the speaker hole 107.

In an embodiment of the disclosure, the sensor module (not illustrated) (e.g., the sensor module 476 of FIG. 4) may generate an electrical signal or a data value that corresponds to an operational state inside the electronic device 101 or an environmental state external to the electronic device 101. For example, the sensor module may include at least one of a proximity sensor, a heart rate monitor (HRM) sensor, a fingerprint sensor, a gesture sensor, a gyro sensor, an atmospheric pressure sensor, a magnetic sensor, an acceleration sensor, a grip sensor, a color sensor, an infrared (IR) sensor, a biosensor, a temperature sensor, a humidity sensor, or an illuminance sensor.

In an embodiment of the disclosure, the camera modules 105, 112, and 113 may include the first camera module 105 (e.g., a punch hole camera) exposed on the first surface 110A of the electronic device 101, the second camera module 112 exposed on the second surface 110B, and/or the flash 113.

In an embodiment of the disclosure, the first camera module 105 may be exposed through a portion of the screen display region 110A and 110D of the display 106. For example, the first camera module 105 may be exposed on a partial area of the screen display region 110A and 110D through an opening (not illustrated) that is formed in a portion of the display 106.

In an embodiment of the disclosure, the second camera module 112 may include a plurality of camera modules (e.g., a dual camera, a triple camera, or a quad camera). However, the second camera module 112 is not necessarily limited to including the plurality of camera modules and may include one camera module.

The first camera module 105 and the second camera module 112 may include one or more lenses, an image sensor, and/or an image signal processor. The flash 113 may include, for example, a light emitting diode or a xenon lamp. In another embodiment of the disclosure, two or more lenses (an IR camera lens, a wide angle lens, and a telephoto lens) and image sensors may be disposed on one surface of the electronic device 101.

In an embodiment of the disclosure, the key input devices 117 may be disposed on the side surface 110C (e.g., the first regions 110D and/or the second regions 110E) of the housing 110. In another embodiment of the disclosure, the electronic device 101 may not include all or some of the key input devices 117, and the key input devices 117 not included may be implemented in a different form, such as a soft key, on the display 106. In another embodiment of the disclosure, the key input devices may include a sensor module (not illustrated) that forms the sensing region (not illustrated) that is included in the screen display region 110A and 110D.

In an embodiment of the disclosure, the connector hole 108 may accommodate a connector. The connector hole 108 may be disposed in the side surface 110C of the housing 110. For example, the connector hole 108 may be disposed in the side surface 110C so as to be adjacent to at least a part of the audio modules (e.g., the microphone hole 103 and the speaker hole 107). In another embodiment of the disclosure, the electronic device 101 may include the first connector hole 108 capable of accommodating a connector (e.g., a USB connector) for transmitting/receiving power and/or data with an external device, and/or a second connector hole (not illustrated) capable of accommodating a connector (e.g., an earphone jack) for transmitting/receiving an audio signal with an external device.

In an embodiment of the disclosure, the electronic device 101 may include the light emitting element (not illustrated). For example, the light emitting element (not illustrated) may be disposed on the first surface 110A of the housing 110. The light emitting element (not illustrated) may provide state information of the electronic device 101 in the form of light. In another embodiment of the disclosure, the light emitting element (not illustrated) may provide a light source that operates in conjunction with operation of the first camera module 105. For example, the light emitting element (not illustrated) may include an LED, an IR LED, and/or a xenon lamp.

A pen input device 185 (e.g., a stylus pen) may be inserted into, or detached from, the housing 110 through a hole 121 formed in the side surface of the housing 110 and may include a button for facilitating the detachment. The pen input device 185 may have a separate resonance circuit embedded therein and may operate in conjunction with an electromagnetic induction panel (e.g., an electromagnetic induction panel 190 of FIG. 1C) included in the electronic device 101. The pen input device 185 may include an electro-magnetic resonance (EMR) type, an active electrical stylus (AES) type, and an electric coupled resonance (ECR) type.

Figure 1C:
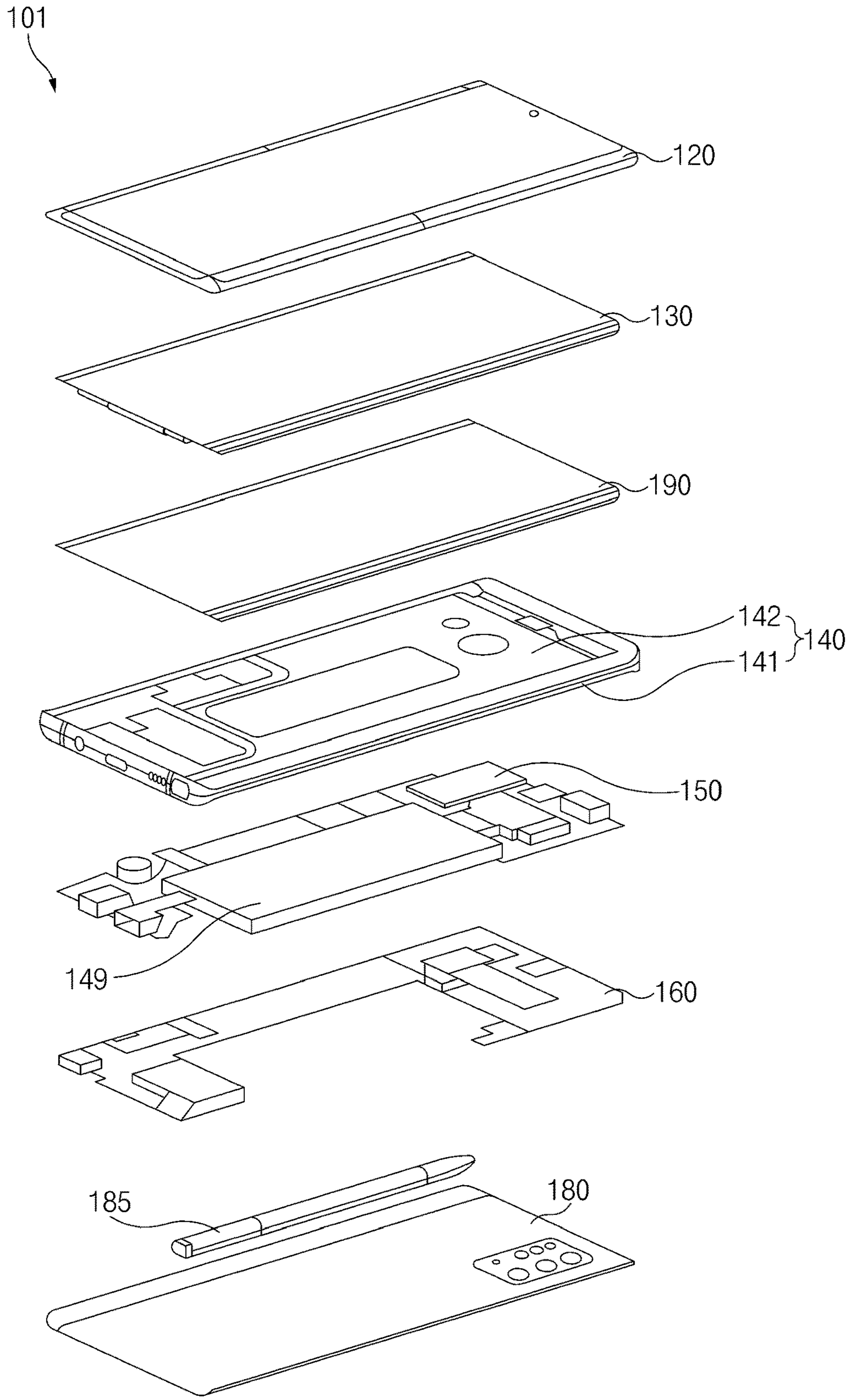
FIG. 1C is an exploded perspective view of an electronic device according to an embodiment of the disclosure.

FIG. 1C is an exploded perspective view of an electronic device according to an embodiment of the disclosure.

Referring to FIG. 1C, the electronic device 101 may include a front plate 120 (e.g., the front plate 102 of FIG. 1A), a display 130 (e.g., the display 106 of FIG. 1A), the electromagnetic induction panel 190, a first support member 140 (e.g., a bracket), a battery 149, a printed circuit board 150, a second support member 160 (e.g., a rear case), and a back plate 180 (e.g., the back plate 111 of FIG. 1B).

In another embodiment of the disclosure, the electronic device 101 may not include at least one component (e.g., the second support member 160) among the aforementioned components, or may additionally include other component(s). At least one of the components of the electronic device 101 may be identical or similar to at least one of the components of the electronic device 101 of FIGS. 1A and 1B, and repetitive descriptions will hereinafter be omitted.

In an embodiment of the disclosure, the front plate 120, the back plate 180, and at least a portion of the first support member 140 (e.g., a frame structure 141) may form a housing (e.g., the housing 110 of FIGS. 1A and 1B).

The electromagnetic induction panel 190 (e.g., a digitizer) may be a panel for sensing an input of the pen input device 185. For example, the electromagnetic induction panel 190 may include a printed circuit board (PCB) (e.g., a flexible printed circuit board (FPCB)) and a shield sheet. The shield sheet may prevent interference between the components by electromagnetic fields generated from the components (e.g., the display module, the printed circuit board, and the electromagnetic induction panel) that are included in the electronic device 101. The shield sheet may block the electromagnetic fields generated from the components, thereby enabling an input from the pen input device 185 to be accurately transferred to a coil included in the electromagnetic induction panel 190. The electromagnetic induction panel 190 according to various embodiments may include an opening formed in at least a partial region corresponding to a biosensor mounted in the electronic device 101.

In an embodiment of the disclosure, the first support member 140 may include the frame structure 141 that forms a surface of the electronic device 101 (e.g., a portion of the side surface 110C of FIG. 1A) and a plate structure 142 that extends from the frame structure 141 toward the inside of the electronic device 101.

The plate structure 142 may be located inside the electronic device 101 and may be connected with the frame structure 141, or may be integrally formed with the frame structure 141. The plate structure 142 may be formed of, for example, a metallic material and/or a non-metallic (e.g., polymer) material. The display 130 may be coupled to one surface of the plate structure 142, and the printed circuit board 150 may be coupled to an opposite surface of the plate structure 142. In an embodiment of the disclosure, a processor, a memory, and/or an interface may be mounted on the printed circuit board 150 and may be electrically connected with a circuit pattern of the printed circuit board 150. The processor may include, for example, one or more of a central processing unit, an application processor, a graphic processing unit, an image signal processor, a sensor hub processor, or a communication processor.

The memory may include, for example, a volatile memory or a non-volatile memory.

The interface may include, for example, a high definition multimedia interface (HDMI), a universal serial bus (USB) interface, a secure digital (SD) card interface, and/or an audio interface. For example, the interface may electrically or physically connect the electronic device 101 with an external device and may include a USB connector, an SD card/multimedia card (MMC) connector, or an audio connector.

In an embodiment of the disclosure, the battery 149 may supply power to at least one of the components of the electronic device 101. For example, the battery 149 may include a primary cell that is not rechargeable, a secondary cell that is rechargeable, or a fuel cell. In an embodiment of the disclosure, at least a portion of the battery 149 may be disposed on substantially the same plane as the printed circuit board 150. In an embodiment of the disclosure, the battery 149 may be integrally disposed inside the electronic device 101, or may be disposed so as to be detachable from the electronic device 101.

Figure 2A:
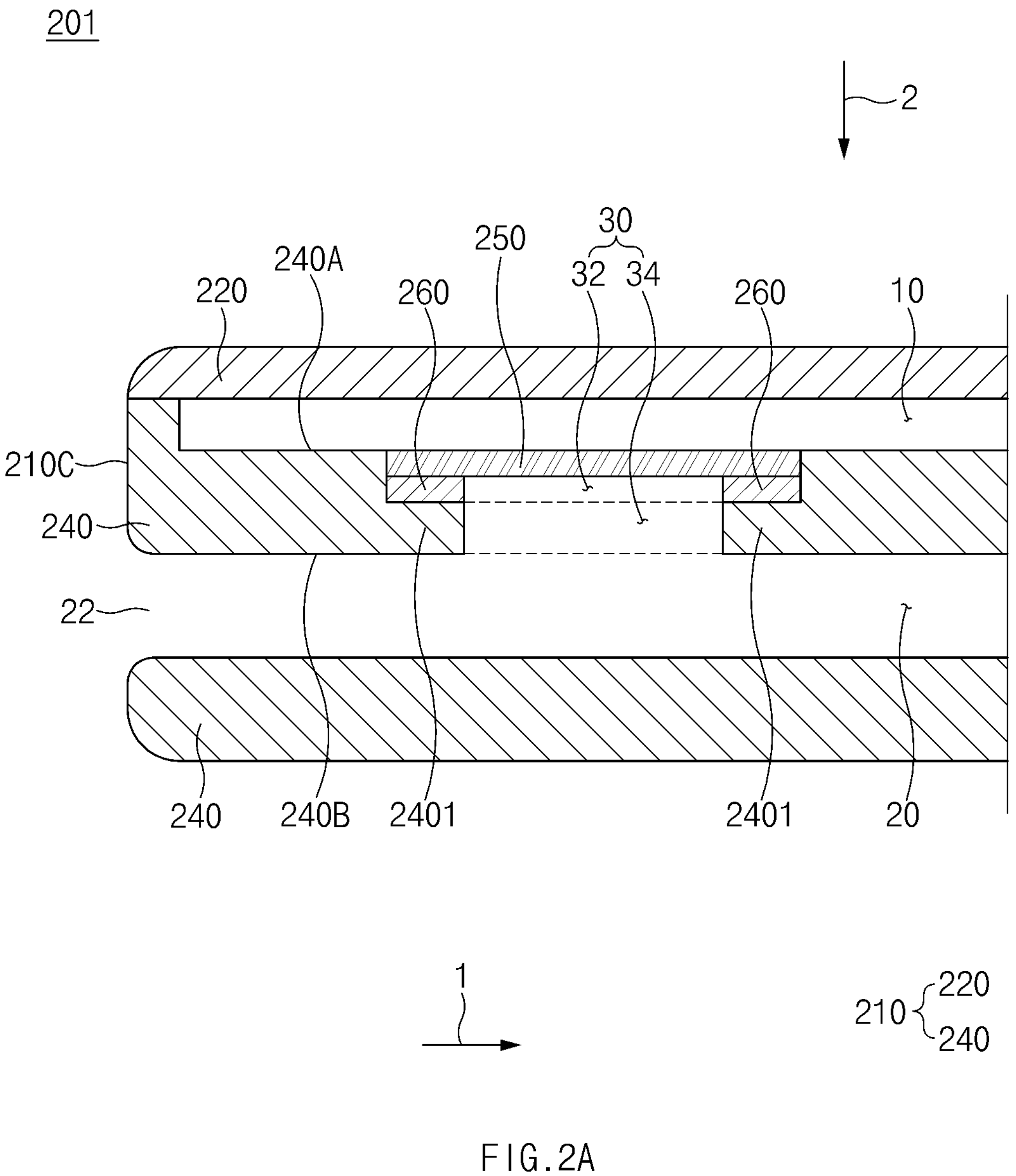
FIG. 2A is a sectional view of an electronic device according to an embodiment of the disclosure.

FIG. 2A is a sectional view of an electronic device according to an embodiment of the disclosure. FIG. 2A may be a sectional view taken along line A-A' of FIG. 1A.

Figure 2B:
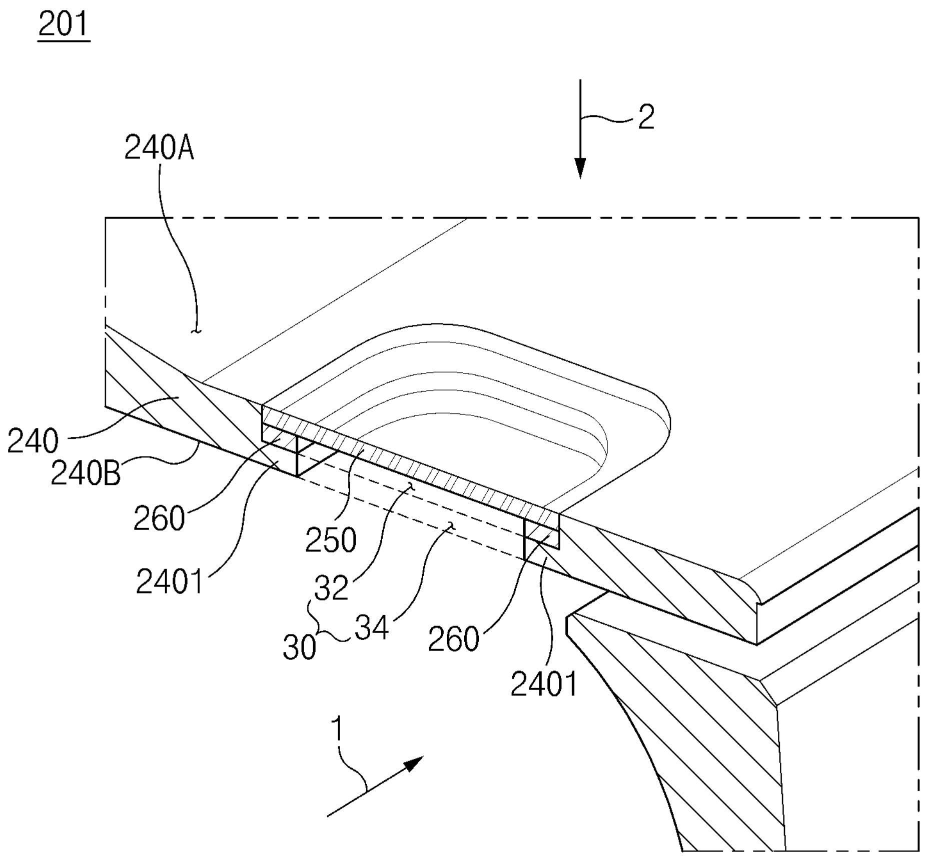
FIG. 2B is a sectional view of an electronic device according to an embodiment of the disclosure.

FIG. 2B is a sectional view of an electronic device according to an embodiment of the disclosure. FIG. 2B may be a sectional view taken along line B-B' of FIG. 1A.

Figure 3:
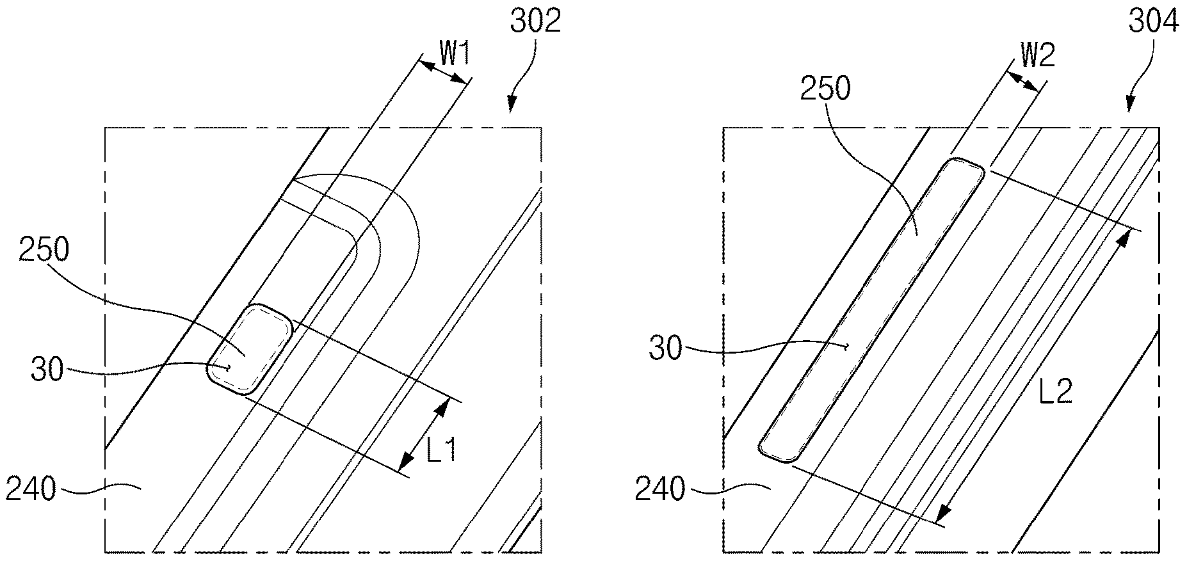
FIG. 3 illustrates a support member having a ventilation member disposed thereon according to an embodiment of the disclosure.

FIG. 3 illustrates a support member having a ventilation member disposed thereon according to an embodiment of the disclosure.

Referring to FIGS. 2A and 2B, an electronic device 201 according to an embodiment of the disclosure (e.g., the electronic device 101 of FIG. 1A) may include a housing 210, a ventilation member 250, and an adhesive member 260.

In an embodiment of the disclosure, the housing 210 (e.g., the housing 110 of FIG. 1A) may include a cover 220 and a support member 240.

In an embodiment of the disclosure, the cover 220 (e.g., the front plate 120 or the back plate 180 of FIG. 1C) may be disposed on the support member 240. In an embodiment of the disclosure, a recess formed on the support member 240 may be at least partially closed by the cover 220, and an inner space 10 may be formed accordingly. In an embodiment of the disclosure, various components of the electronic device 201 (e.g., the printed circuit board 150 of FIG. 1C) may be disposed in the inner space 10 of the housing 210.

In an embodiment of the disclosure, the support member 240 (e.g., the first support member 140 and/or the second support member 160 of FIG. 1C) may form at least a portion of a side surface 210C of the electronic device 201 (e.g., the side surface 110C of FIG. 1A). In an embodiment of the disclosure, the support member 240 may have an opening 22 formed therein. For example, the opening 22 may be formed in the side surface 210C. In an embodiment of the disclosure, a receiving hole 20 extending from the opening 22 toward the inside of the electronic device 201 may be formed in the support member 240. For example, the receiving hole 20 may extend from the opening 22 in a first direction 1 (e.g., the +Y direction of FIG. 1A). In an embodiment of the disclosure, a pen input device of the electronic device 201 (e.g., the pen input device 185 of FIG. 1C) may be accommodated in the receiving hole 20.

In an embodiment of the disclosure, the support member 240 may include a first surface 240A adjacent to the inner space 10 and a second surface 240B adjacent to the receiving hole 20. At least a portion of the inner space 10 may be formed by the first surface 240A of the support member 240, and at least a portion of the receiving hole 20 may be formed by the second surface 240B of the support member 240.

In an embodiment of the disclosure, a through-hole 30 extending from the first surface 240A to the second surface 240B may be formed in the support member 240. In an embodiment of the disclosure, the through-hole 30 may fluidically connect the receiving hole 20 and the inner space 10.

In an embodiment of the disclosure, the ventilation member 250 may be disposed on the support member 240 to cover an open side of the through-hole 30 formed in the support member 240. In an embodiment of the disclosure, the ventilation member 250 may be attached to the support member 240 through the adhesive member 260. In an embodiment of the disclosure, the adhesive member 260 may include an adhesive liquid or an adhesive tape that contains a silicone-based resin and/or an acrylic-based resin, but is not limited thereto.

In an embodiment of the disclosure, the through-hole 30 formed in the support member 240 may include a first opening 32 and a second opening 34 that have different areas. The first opening 32 may be located between the inner space 10 and the second opening 34, and the second opening 34 may be located between the first opening 32 and the receiving hole 20. The first opening 32 may have a larger area than the second opening 34, and thus a step 2401 may be formed in the support member 240. The adhesive member 260 may be seated on the step 2401 and may be located in the first opening 32. When the support member 240 is viewed from above (e.g., when the support member 240 is viewed in a second direction 2 perpendicular to the first direction 1), the adhesive member 260 may have an annular shape in which a hollow corresponding to the second opening 34 is formed and that overlaps the step 2401. The ventilation member 250 disposed on the adhesive member 260 may be at least partially accommodated in the first opening 32. In this case, the ventilation member 250 may have substantially the same area and shape as the first opening 32. In an embodiment of the disclosure, the ventilation member 250 may be accommodated in the first opening 32 so as to extend without a step with the support member 240 (or, the first surface 240A of the support member 240), but is not limited thereto. In another embodiment of the disclosure, the ventilation member 250 may protrude outside the first opening 32 of the support member 240.

In another embodiment of the disclosure, unlike those illustrated in the drawings, the first opening 32 and the second opening 34 of the through-hole 30 may have the same area. In this case, the ventilation member 250 may have a larger area than the through-hole 30 and may cover the through-hole 30 from outside the through-hole 30.

In an embodiment of the disclosure, although the ventilation member 250 is illustrated as being disposed in the first opening 32 of the support member 240 and adjacent to the inner space 10, the ventilation member 250 is not limited thereto, and various design changes can be made. For example, the ventilation member 250 may be disposed on the support member 240 so as to be adjacent to the receiving hole 20. In other words, although the one side of the through-hole 30 adjacent to the inner space 10 is illustrated as being closed by the ventilation member 250, unlike that illustrated in the drawings, the ventilation member 250 may close an opposite side of the through-hole 30 adjacent to the receiving hole 20. In this case, the areas of the first opening 32 and the second opening 34 may be opposite to those illustrated in the drawings, and the ventilation member 250 may be accommodated in the second opening 34. Alternatively, the ventilation member 250 may be disposed on the second surface 240B of the support member 240 to cover the through-hole 30 from outside the through-hole 30.

In an embodiment of the disclosure, the ventilation member 250 may pass air and may block foreign matter (e.g., moisture and dust). In an embodiment of the disclosure, the ventilation member 250 may include a membrane through which a specific material is selectively permeable. For example, the ventilation member 250 may include an expanded polymerized tetrafluoroethylene (ePTFE) membrane formed by expanding polymerized tetrafluoroethylene (PTFE). However, the disclosure is not limited thereto, and to allow the ventilation member 250 to selectively transmit only air, various structures and/or materials applicable by those skilled in the art may be used.

In an embodiment of the disclosure, the inner space 10 of the housing 210 and an external environment may remain the same through the ventilation member 250 disposed between the inner space 10 and the receiving hole 20. For example, the inner space 10 may be fluidically connected with the through-hole 30 and the receiving hole 20 through the ventilation member 250, and the receiving hole 20 may be fluidically connected with the external environment. Since air circulates between the inner space 10 of the housing 210 and the external environment through the ventilation member 250, environments (e.g., pressures) inside/outside the electronic device 201 may remain in equilibrium.

In an embodiment of the disclosure, through the ventilation member 250, introduction of foreign matter into the inner space 10 of the housing 210 may be prevented.

In an embodiment of the disclosure, the through-hole 30 may be formed in the receiving hole 20 of the support member 240 without limitations of position, shape, and area. For example, referring to reference numeral 302 of FIG. 3, the through-hole 30 (or, the ventilation member 250) may have a first width W1 and a first length L1. In another example, referring to reference numeral 304 of FIG. 3, the through-hole 30 (or, the ventilation member 250) may have a second width W2 smaller than the first width W1 and a second length L2 greater than the first length L1. In another example, the through-hole 30 (or, the ventilation member 250) may have a circular shape, an oval shape, a polygonal shape, or a shape different from the aforementioned shapes, instead of the illustrated quadrangular shape having rounded corners. According to an embodiment of the disclosure, the degrees of freedom in the design of the position, shape, and area of the through-hole 30 may be secured depending on ventilation performance required for the electronic device 201. In addition, since the through-hole 30 is formed inside the housing 210 and is not visible from outside the electronic device 201, the aesthetics of the electronic device 201 may be prevented from being spoiled by a ventilation hole exposed to the outside.

An electronic device (e.g., the electronic device 201 of FIG. 2A) according to the above-described various embodiments may include a housing (e.g., the housing 210 of FIG.

2A) that forms a side surface (e.g., the side surface 210C of FIG. 2A) and an inner space (e.g., the inner space 10 of FIG. 2A) of the electronic device and a ventilation member (e.g., the ventilation member 250 of FIG. 2A). The housing may include an opening (e.g., the opening 22 of FIG. 2A) located in the side surface, a receiving hole (e.g., the receiving hole 20 of FIG. 2A) that extends from the opening such that an external device is accommodated in the receiving hole, and a through-hole (e.g., the through-hole 30 of FIG. 2A) that fluidically connects the receiving hole and the inner space. The ventilation member may be disposed in the housing to cover the through-hole.

In an embodiment of the disclosure, the through-hole may include a first opening (e.g., the first opening 32 of FIG. 2A) and a second opening (e.g., the second opening 34 of FIG. 2A) fluidically connected with the first opening, and the housing may include a step (e.g., the step 2401 of FIG. 2A) defined by the second opening having a smaller area than the first opening.

In an embodiment of the disclosure, the ventilation member may be seated on the step and may be at least partially located in the first opening.

In an embodiment of the disclosure, the ventilation member may have a polygonal shape (e.g. quadrangular shape), a circular shape, or an oval shape.

In an embodiment of the disclosure, the electronic device may further include an adhesive member (e.g., the adhesive member 260 of FIG. 2A) interposed between the step and the ventilation member, and a hole corresponding to the second opening may be formed in the adhesive member.

In an embodiment of the disclosure, the first opening may be adjacent to the inner space or the receiving hole, and the second opening may be adjacent to the receiving hole or the inner space.

In an embodiment of the disclosure, the housing may include a first surface (e.g., the first surface 240A of FIG. 2A) that forms at least a portion of the inner space and a second surface (e.g., the second surface 240B of FIG. 2A) that forms at least a portion of the receiving hole. The through-hole may extend from the first surface to the second surface, and the ventilation member located in the first opening may extend without a step with the first surface or the second surface of the housing.

In an embodiment of the disclosure, the housing may include a first surface (e.g., the first surface 210A of FIG. 2A) that forms at least a portion of the inner space and a second surface (e.g., the second surface 240B of FIG. 2A) that forms at least a portion of the receiving hole. The through-hole may extend from the first surface to the second surface, and the ventilation member may be disposed on the first surface or the second surface to cover the through-hole.

In an embodiment of the disclosure, the housing may include a support member (e.g., the support member 240 of FIG. 2A) and a cover (e.g., the cover 220 of FIG. 2A). The cover may be seated on the support member to form the inner space together with the support member, and the receiving hole and the through-hole may be formed in the support member.

In an embodiment of the disclosure, the ventilation member may be configured to block moisture and pass air.

In an embodiment of the disclosure, the external device may include an electronic pen (e.g., the pen input device 185 of FIG. 1A).

A housing (e.g., the housing 210 of FIG. 2A) of an electronic device (e.g., the electronic device 201 of FIG. 2A) according to the above-described various embodiments may include a support member (e.g., the support member 240 of FIG. 2A), a cover (e.g., the cover 220 of FIG. 2A) disposed on the support member, and a ventilation member (e.g., the ventilation member 250 of FIG. 2A). The support member and the cover may form an inner space (e.g., the inner space 10 of FIG. 2A) of the housing together. The support member may include a receiving hole (e.g., the receiving hole 20 of FIG. 2A) in which an electronic pen (e.g., the pen input device 185 of FIG. 1A) is accommodated and a through-hole (e.g., the through-hole 30 of FIG. 2A) that fluidically connects the receiving hole and the inner space. The ventilation member may be disposed on the support member to cover the through-hole.

In an embodiment of the disclosure, the through-hole may include a first opening (e.g., the first opening 32 of FIG. 2A) and a second opening (e.g., the second opening 34 of FIG. 2A) fluidically connected with the first opening, and the support member may include a step (e.g., the step 2401 of FIG. 2A) defined by the second opening having a smaller area than the first opening.

In an embodiment of the disclosure, the ventilation member may be seated on the step and may be at least partially located in the first opening.

In an embodiment of the disclosure, the ventilation member may have a polygonal shape (e.g. quadrangular shape), a circular shape, or an oval shape.

In an embodiment of the disclosure, the electronic device may further include an adhesive member (e.g., the adhesive member 250 of FIG. 2A) interposed between the step and the ventilation member, and a hole corresponding to the second opening may be formed in the adhesive member.

In an embodiment of the disclosure, the first opening may be adjacent to the inner space or the receiving hole, and the second opening may be adjacent to the receiving hole or the inner space.

In an embodiment of the disclosure, the support member may include a first surface (e.g., the first surface 240A of FIG. 2A) that forms at least a portion of the inner space and a second surface (e.g., the second surface 240B of FIG. 2A) that forms at least a portion of the receiving hole. The through-hole may extend from the first surface to the second surface, and the ventilation member located in the first opening may extend without a step with the first surface or the second surface of the support member.

In an embodiment of the disclosure, the support member may include a first surface (e.g., the first surface 240A of FIG. 2A) that forms at least a portion of the inner space and a second surface (e.g., the second surface 240B of FIG. 2A) that forms at least a portion of the receiving hole. The through-hole may extend from the first surface to the second surface, and the ventilation member may be disposed on the first surface or the second surface to cover the through-hole.

In an embodiment of the disclosure, the ventilation member may be configured to block moisture and pass air.

FIG. 4 is a block diagram illustrating an electronic device in a network environment 400 according to an embodiment of the disclosure.

Referring to FIG. 4, an electronic device 401 in the network environment 400 may communicate with an external electronic device 402 via a first network 498 (e.g., a short-range wireless communication network), or at least one of an external electronic device 404 or a server 408 via a second network 499 (e.g., a long-range wireless communication network). According to an embodiment of the disclosure, the electronic device 401 may communicate with the external electronic device 404 via the server 408. According to an embodiment of the disclosure, the electronic device 401 may include a processor 420, a memory 430, an input module 450, a sound output module 455, a display module 460, an audio module 470, a sensor module 476, an interface 477, a connecting terminal 478, a haptic module 479, a camera module 480, a power management module 488, a battery 489, a communication module 490, a subscriber identification module (SIM) 496, or an antenna module 497. In some embodiments of the disclosure, at least one of the components (e.g., the connecting terminal 478) may be omitted from the electronic device 401, or one or more other components may be added in the electronic device 401. In some embodiments of the disclosure, some of the components (e.g., the sensor module 476, the camera module 480, or the antenna module 497) may be implemented as a single component (e.g., the display module 460).

The processor 420 may execute, for example, software (e.g., a program 440) to control at least one other component (e.g., a hardware or software component) of the electronic device 401 coupled with the processor 420, and may perform various data processing or computation. According to one embodiment of the disclosure, as at least part of the data processing or computation, the processor 420 may store a command or data received from another component (e.g., the sensor module 476 or the communication module 490) in a volatile memory 432, process the command or the data stored in the volatile memory 432, and store resulting data in a non-volatile memory 434. According to an embodiment of the disclosure, the processor 420 may include a main processor 421 (e.g., a central processing unit (CPU) or an application processor (AP)), or an auxiliary processor 423 (e.g., a graphics processing unit (GPU), a neural processing unit (NPU), an image signal processor (ISP), a sensor hub processor, or a communication processor (CP)) that is operable independently from, or in conjunction with, the main processor 421. For example, when the electronic device 401 includes the main processor 421 and the auxiliary processor 423, the auxiliary processor 423 may be adapted to consume less power than the main processor 421, or to be specific to a specified function. The auxiliary processor 423 may be implemented as separate from, or as part of the main processor 421.

The auxiliary processor 423 may control at least some of functions or states related to at least one component (e.g., the display module 460, the sensor module 476, or the communication module 490) among the components of the electronic device 401, instead of the main processor 421 while the main processor 421 is in an inactive (e.g., a sleep) state, or together with the main processor 421 while the main processor 421 is in an active state (e.g., executing an application). According to an embodiment of the disclosure, the auxiliary processor 423 (e.g., an image signal processor or a communication processor) may be implemented as part of another component (e.g., the camera module 480 or the communication module 490) functionally related to the auxiliary processor 423. According to an embodiment of the disclosure, the auxiliary processor 423 (e.g., the neural processing unit) may include a hardware structure specified for artificial intelligence model processing. An artificial intelligence model may be generated by machine learning. Such learning may be performed, e.g., by the electronic device 401 where the artificial intelligence is performed or via a separate server (e.g., the server 408). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted-21-oltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 430 may store various data used by at least one component (e.g., the processor 420 or the sensor module 476) of the electronic device 401. The various data may include, for example, software (e.g., the program 440) and input data or output data for a command related thererto. The memory 430 may include the volatile memory 432 or the non-volatile memory 434.

The program 440 may be stored in the memory 430 as software, and may include, for example, an operating system (OS) 442, middleware 444, or an application 446.

The input module 450 may receive a command or data to be used by another component (e.g., the processor 420) of the electronic device 401, from the outside (e.g., a user) of the electronic device 401. The input module 450 may include, for example, a microphone, a mouse, a keyboard, a key (e.g., a button), or a digital pen (e.g., a stylus pen).

The sound output module 455 may output sound signals to the outside of the electronic device 401. The sound output module 455 may include, for example, a speaker or a receiver. The speaker may be used for general purposes, such as playing multimedia or playing record. The receiver may be used for receiving incoming calls. According to an embodiment of the disclosure, the receiver may be implemented as separate from, or as part of the speaker.

The display module 460 may visually provide information to the outside (e.g., a user) of the electronic device 460. The display module 460 may include, for example, a display, a hologram device, or a projector and control circuitry to control a corresponding one of the display, hologram device, and projector. According to an embodiment of the disclosure, the display module 460 may include a touch sensor adapted to detect a touch, or a pressure sensor adapted to measure the intensity of force incurred by the touch.

The audio module 470 may convert a sound into an electrical signal and vice versa. According to an embodiment of the disclosure, the audio module 470 may obtain the sound via the input module 450, or output the sound via the sound output module 455 or a headphone of an external electronic device (e.g., the external electronic device 402) directly (e.g., wiredly) or wirelessly coupled with the electronic device 401.

The sensor module 476 may detect an operational state (e.g., power or temperature) of the electronic device 401 or an environmental state (e.g., a state of a user) external to the electronic device 401, and then generate an electrical signal or data value corresponding to the detected state. According to an embodiment of the disclosure, the sensor module 476 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 477 may support one or more specified protocols to be used for the electronic device 401 to be coupled with the external electronic device (e.g., the external electronic device 402) directly (e.g., wiredly) or wirelessly. According to an embodiment of the disclosure, the interface 477 may include, for example, a high definition multimedia interface (HDMI), a universal serial bus (USB) interface, a secure digital (SD) card interface, or an audio interface.

A connecting terminal 478 may include a connector via which the electronic device 401 may be physically connected with the external electronic device (e.g., the external electronic device 402). According to an embodiment of the disclosure, the connecting terminal 478 may include, for example, an HDMI connector, a USB connector, an SD card connector, or an audio connector (e.g., a headphone connector).

The haptic module 479 may convert an electrical signal into a mechanical stimulus (e.g., a vibration or a movement) or electrical stimulus which may be recognized by a user via his tactile sensation or kinesthetic sensation. According to an embodiment of the disclosure, the haptic module 479 may include, for example, a motor, a piezoelectric element, or an electric stimulator.

The camera module 480 may capture a still image or moving images. According to an embodiment of the disclosure, the camera module 480 may include one or more lenses, image sensors, image signal processors, or flashes.

The power management module 488 may manage power supplied to the electronic device 401. According to one embodiment of the disclosure, the power management module 488 may be implemented as at least part of, for example, a power management integrated circuit (PMIC).

The battery 489 may supply power to at least one component of the electronic device 401. According to an embodiment of the disclosure, the battery 489 may include, for example, a primary cell which is not rechargeable, a secondary cell which is rechargeable, or a fuel cell.

The communication module 490 may support establishing a direct (e.g., wired) communication channel or a wireless communication channel between the electronic device 401 and the external electronic device (e.g., the external electronic device 402, the external electronic device 404, or the server 408) and performing communication via the established communication channel. The communication module 490 may include one or more communication processors that are operable independently from the processor 420 (e.g., the application processor (AP)) and supports a direct (e.g., wired) communication or a wireless communication. According to an embodiment of the disclosure, the communication module 490 may include a wireless communication module 492 (e.g., a cellular communication module, a short-range wireless communication module, or a global navigation satellite system (GNSS) communication module) or a wired communication module 494 (e.g., a local area network (LAN) communication module or a power line communication (PLC) module). A corresponding one of these communication modules may communicate with the external electronic device via the first network 498 (e.g., a short-range communication network, such as Bluetooth™, wireless-fidelity (Wi-Fi) direct, or infrared data association (IrDA)) or the second network 499 (e.g., a long-range communication network, such as a legacy cellular network, a fifth generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 492 may identify and authenticate the electronic device 401 in a communication network, such as the first network 498 or the second network 499, using subscriber information (e.g., international mobile subscriber identity (IMSI)) stored in the subscriber identification module 496.

The wireless communication module 492 may support a 5G network, after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 492 may support a high-frequency band (e.g., the millimeter wave (mmWave) band) to achieve, e.g., a high data transmission rate. The wireless communication module 492 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 492 may support various requirements specified in the electronic device 401, an external electronic device (e.g., the external electronic device 404), or a network system (e.g., the second network 499). According to an embodiment of the disclosure, the wireless communication module 492 may support a peak data rate (e.g., 20 gigabits per second (Gbps) or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 497 may transmit or receive a signal or power to or from the outside (e.g., the external electronic device) of the electronic device 401. According to an embodiment of the disclosure, the antenna module 497 may include an antenna including a radiating element including a conductive material or a conductive pattern formed in or on a substrate (e.g., a printed circuit board (PCB)). According to an embodiment of the disclosure, the antenna module 497 may include a plurality of antennas (e.g., array antennas). In such a case, at least one antenna appropriate for a communication scheme used in the communication network, such as the first network 498 or the second network 499, may be selected, for example, by the communication module 490 (e.g., the wireless communication module 492) from the plurality of antennas. The signal or the power may then be transmitted or received between the communication module 490 and the external electronic device via the selected at least one antenna. According to an embodiment of the disclosure, another component (e.g., a radio frequency integrated circuit (RFIC)) other than the radiating element may be additionally formed as part of the antenna module 497.

According to various embodiments of the disclosure, the antenna module 497 may form a mmWave antenna module. According to an embodiment of the disclosure, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 401 and the external electronic device 404 via the server 408 coupled with the second network 499. Each of the electronic devices 402 or 404 may be a device of a same type as, or a different type, from the electronic device 401. According to an embodiment of the disclosure, all or some of operations to be executed at the electronic device 401 may be executed at one or more of the external electronic devices 402, 404, or 408. For example, if the electronic device 401 should perform a function or a service automatically, or in response to a request from a user or another device, the electronic device 401, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 401. The electronic device 401 may provide the outcome, with or without further processing of the outcome, as at least part of a reply to the request. To that end, a cloud computing, distributed computing, mobile edge computing (MEC), or client-server computing technology may be used, for example. The electronic device 401 may provide ultra low-latency services using, e.g., distributed computing or mobile edge computing. In another embodiment of the disclosure, the external electronic device 404 may include an internet-of-things (IoT) device. The server 408 may be an intelligent server using machine learning and/or a neural network. According to an embodiment of the disclosure, the external electronic device 404 or the server 408 may be included in the second network 499. The electronic device 401 may be applied to intelligent services (e.g., a smart home, a smart city, a smart car, or healthcare) based on 5G communication technology or IoT-related technology.

The electric device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as “A or B,” “at least one of A and B,” “at least one of A or B,” “A, B, or C,” “at least one of A, B, and C,” and “at least one of A, B, or C,” may include any one of, or all possible combinations of the items enumerated together in a corresponding one of the phrases. As used herein, such terms as “$1^{st}$” and “$2^{nd}$,” or “first” and “second” may be used to simply distinguish a corresponding component from another, and does not limit the component in other feature (e.g., importance or order). It is to be understood that when an element (e.g., a first element) is referred to, with or without the term “operatively” or “communicatively”, as “coupled with,” “coupled to,” “connected with,” or “connected to” another element (e.g., a second element), it means that the element may be coupled with the other element directly (e.g., wiredly), wirelessly, or via a third element.

As used in connection with various embodiments of the disclosure, the term “module” may include a unit implemented in hardware, software, or firmware, and may interchangeably be used with other terms, for example, “logic.” “logic block,” “part,” or “circuitry”. A module may be a signal integral component, or a minimum unit or part hereof, adapted to perform one or more functions. For example, according to an embodiment of the disclosure, the module may be implemented in a form of an application-specific integrated circuit (ASIC).

Various embodiments as set forth herein may be implemented as software (e.g., the program 440) including one or more instructions that are stored in a storage medium (e.g., an internal memory 436 or wan external memory 438) that is readable by a machine (e.g., the electronic device 401). For example, a processor (e.g., the processor 420) of the machine (e.g., the electronic device 401) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in form of a non-transitory storage medium. Wherein, the term “non-transitory” simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment of the disclosure, a method according to various embodiments of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer’s server, a server of the application store, or a relay server.

In various embodiments of the disclosure, each component (e.g., a module or a program) of the above-described components may include a single entity or multiple entities, and some of the multiple entities may be separately disposed in different components. In various embodiments of the disclosure, one or more of the above-described components may be omitted, or one or more other component may be added. In alternative or additional embodiments of the disclosure, a plurality of components (e.g., modules or programs) may be integrated into a single component. In such a case, in various embodiments of the disclosure, the integrated component may still perform one or more functions of each of the plurality of components in the same or similar manner as they are performed by a corresponding one of the plurality of components before the integration. In various embodiments of the disclosure, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:

a housing configured to form a side surface and an inner space of the electronic device, the housing including a cover; and a ventilation member disposed in the housing, wherein the housing includes:

an opening located in the side surface, a receiving hole configured to extend from the opening such that an external device is accommodated in the receiving hole, and a through-hole configured to fluidically connect the receiving hole and the inner space, wherein the ventilation member is disposed in the housing to cover the through-hole, and wherein the through-hole overlaps both a portion of the receiving hole and a portion of the inner space along a direction from the cover toward the ventilation member.

2. The electronic device of claim 1, wherein the housing further includes a support member, wherein the through-hole includes a first opening and a second opening fluidically connected with the first opening, wherein the second opening has a smaller area than the first opening, and wherein the support member includes a step formed by a difference in area between the first opening and the second opening.

3. The electronic device of claim 2, wherein the ventilation member is seated on the step and at least partially located in the first opening.

4. The electronic device of claim 3, wherein the ventilation member has a polygonal shape, a circular shape, or an oval shape.

5. The electronic device of claim 3, further comprising:

an adhesive member interposed between the step and the ventilation member, wherein a hole corresponding to the second opening is formed in the adhesive member.

6. The electronic device of claim 5, wherein the first opening is adjacent to the inner space or the receiving hole, and wherein the second opening is adjacent to the receiving hole or the inner space.

7. The electronic device of claim 6, wherein the housing further includes a first surface configured to form at least a portion of the inner space and a second surface configured to form at least a portion of the receiving hole, wherein the through-hole extends from the first surface to the second surface, and wherein the ventilation member located in the first opening extends without a step with the first surface or the second surface of the housing.

8. The electronic device of claim 1, wherein the housing further includes a first surface configured to form at least a portion of the inner space and a second surface configured to form at least a portion of the receiving hole, wherein the through-hole extends from the first surface to the second surface, and wherein the ventilation member is disposed on the first surface or the second surface to cover the through-hole.

9. The electronic device of claim 1, wherein the housing further includes a support member, wherein the cover is seated on the support member to form the inner space together with the support member, and wherein the receiving hole and the through-hole are formed in the support member.

10. The electronic device of claim 1, wherein the ventilation member is configured to block moisture and pass air, and wherein the external device includes an electronic pen.

11. The electronic device of claim 1, wherein the housing further includes a support member, and wherein, when the external device is accommodated in the receiving hole, the through-hole overlaps the portion of the receiving hole, the portion of the inner space, a portion of the support member, and a portion of the external device along the direction from the cover toward the external device.

12. A housing of an electronic device, the housing comprising:

a support member;

a cover disposed on the support member; and a ventilation member, wherein the support member and the cover together form an inner space of the housing, wherein the support member includes:

a receiving hole in which an electronic pen is accommodated; and a through-hole configured to fluidically connect the receiving hole and the inner space, wherein the ventilation member is disposed on the support member to cover the through-hole, and wherein the through-hole overlaps both a portion of the receiving hole and a portion of the inner space along a direction from the cover toward the ventilation member.

13. The housing of claim 12, wherein the through-hole includes a first opening and a second opening fluidically connected with the first opening, wherein the second opening has a smaller area than the first opening, and wherein the support member includes a step formed by a difference in area between the first opening and the second opening.

14. The housing of claim 13, wherein the ventilation member is seated on the step and at least partially located in the first opening.

15. The housing of claim 14, wherein the ventilation member has a polygonal shape, a circular shape, or an oval shape.

16. The housing of claim 14, further comprising:

an adhesive member interposed between the step and the ventilation member, wherein a hole corresponding to the second opening is formed in the adhesive member.

17. The housing of claim 16, wherein the first opening is adjacent to the inner space or the receiving hole, and wherein the second opening is adjacent to the receiving hole or the inner space.

18. The housing of claim 17, wherein the support member further includes a first surface configured to form at least a portion of the inner space and a second surface configured to form at least a portion of the receiving hole, wherein the through-hole extends from the first surface to the second surface, and wherein the ventilation member located in the first opening extends without a step with the first surface or the second surface of the support member.

19. The housing of claim 12, wherein the support member further includes a first surface configured to form at least a portion of the inner space and a second surface configured to form at least a portion of the receiving hole, wherein the through-hole extends from the first surface to the second surface, and wherein the ventilation member is disposed on the first surface or the second surface to cover the through-hole.

20. The housing of claim 12, wherein the ventilation member is configured to block moisture and pass air.

* * * * *